United States Patent [19]

Kauchi et al.

[11] Patent Number: 5,126,826

[45] Date of Patent: Jun. 30, 1992

[54] LIGHT-EMITTING OR RECEIVING DEVICE AND METHOD FOR PREPARING THE SAME

[75] Inventors: Kakutaro Kauchi, Chiba; Toru Tomoshige, Ichihara; Shoji Usuda, Osaka; Hideyuki Kitayama, Osaka; Toshikazu Takagi, Osaka, all of Japan

[73] Assignee: Mitsui Petrochemical Industries, Ltd., Tokyo, Japan

[21] Appl. No.: 588,835

[22] Filed: Sep. 27, 1990

[30] Foreign Application Priority Data

Sep. 29, 1989 [JP] Japan .................. 1-254538

[51] Int. Cl.⁵ ............................. H01L 23/28
[52] U.S. Cl. ........................ 357/72; 528/31; 528/32; 357/78; 357/74
[58] Field of Search ............ 357/72, 545, 17, 24, 357/19, 78; 528/10, 31, 32

[56] References Cited

U.S. PATENT DOCUMENTS

| | | | |
|---|---|---|---|
| 4,032,963 | 6/1977 | Thome | 357/72 |
| 4,278,784 | 7/1981 | Wong | 357/72 |
| 4,480,009 | 10/1984 | Berger | 357/8 |
| 4,623,705 | 11/1986 | Romano et al. | |
| 4,626,556 | 12/1986 | Nozue et al. | 357/72 |
| 4,777,520 | 10/1988 | Nambu et al. | 357/72 |
| 5,008,733 | 4/1991 | Mine et al. | 357/84 |

FOREIGN PATENT DOCUMENTS

| | | |
|---|---|---|
| 0110447 | 6/1984 | European Pat. Off. |
| 0114080 | 7/1984 | European Pat. Off. |
| 0335688 | 10/1989 | European Pat. Off. |
| 2702921 | 1/1976 | Fed. Rep. of Germany .... 357/54 S |

OTHER PUBLICATIONS

Hawley's Condensed Chemical Dictionary, Eleventh Edition, 1987, pp. 41, 390, 1039-1040.
Patent Abstract of Japan, vol. 9, No. 208, Aug. 24, 1985.
Patent Abstract of Japan, vol. 12, No. 285, Aug. 4, 1988.
Patent Abstract of Japan, vol. 12, 125, Apr. 19, 1988.
Patent Abstract of Japan, vol. 8, No. 93, Apr. 27, 1984.

*Primary Examiner*—Andrew J. James
*Assistant Examiner*—Courtney A. Bowers
*Attorney, Agent, or Firm*—Sherman and Shalloway

[57] ABSTRACT

A light-emitting or receiving device comprising a light-emitting or receiving element coated with a silicone resin composition and an encapsulating means for encapsulating said light-emitting or receiving element, said encapsulating means comprising a polymer of a monomer, an oligomer or a mixture thereof comprising a diallyl compound. The device has improved weatherability, chemical resistance, hardness, optical properties such as transparency, and moisture resistance.

6 Claims, 1 Drawing Sheet

LIGHT-EMITTING OR RECEIVING DEVICE AND METHOD FOR PREPARING THE SAME

BACKGROUND OF THE INVENTION

This invention relates to light-emitting or receiving devices (or parts) such as LED, laser diodes, and photo-sensors, and more particularly, to light-emitting or receiving devices having improved weatherability, chemical resistance, hardness, moisture or water resistance, and optical properties.

The prior art light-emitting or receiving devices such as LED, laser diodes, and photo-sensors have been manufactured through encapsulation of light-emitting diodes and similar elements by casting epoxy resin followed by polymerization.

The light-emitting or receiving devices encapsulated with epoxy resin, however, have the following drawbacks.

(1) Since the epoxy resin has poor weatherability, its outdoor use is substantially limited. This is because light-emitting elements experience a drastic drop in luminous power with a lapse of time and light-receiving elements experience a drop in light-receiving sensitivity with a lapse of time when used outdoors.

(2) Since it takes a long time of 5 to 20 hours to cure the epoxy resin, the productivity of light-emitting or receiving devices is low.

(3) Since the epoxy resin has poor mold release characteristics after its cast-polymerization, the productivity of light-emitting or receiving devices is low.

If a mold release agent is used to improve mold release, it would be necessary to remove the mold release agent adhered to the surface of the epoxy resin encapsulant, resulting in a complicated production process.

SUMMARY OF THE INVENTION

An object of the present invention is to overcome the above-mentioned problems of the prior art and to provide a light-emitting or receiving device having improved weatherability, chemical resistance, hardness, moisture resistance, and optical properties.

According to the present invention, there is provided a light-emitting or receiving device comprising a light-emitting or receiving element coated with a silicone resin composition and an encapsulating means for encapsulating said light-emitting or receiving element, said encapsulating means comprising a polymer of a monomer, an oligomer or a mixture thereof comprising a diallyl compound.

According to the present invention, there is also provided a method for preparing such a light-emitting or receiving device.

DETAILED DESCRIPTION OF THE INVENTION

Figure 1:
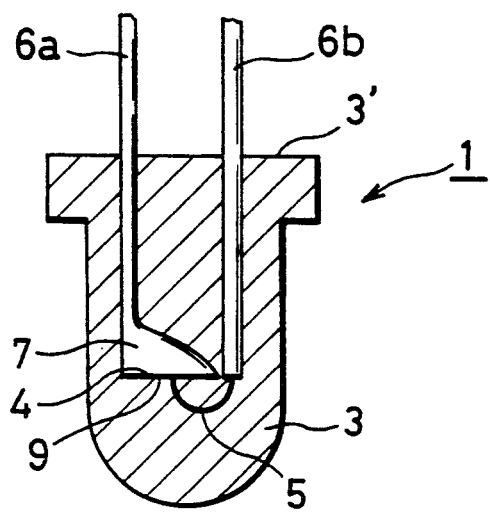
FIG. 1 is a vertical cross-sectional view of a light-emitting or receiving device according to one embodiment of the present invention.

The invention will be described in detail by referring to the preferred embodiments shown in the drawings.

FIG. 1 illustrates one preferred embodiment of the light-emitting or receiving device according to the present invention.

The light-emitting or receiving device 1 according to the present invention may be any such device and is not particularly limited in shape or the like insofar as a light-emitting or receiving element 4, for example, a diode 4 is coated with a specific silicone resin composition 9, and the light-emitting or receiving element 4 is encapsulated with an encapsulating means 3 comprising a specific encapsulating polymer.

In general, lead frames 6a and 6b which project beyond the encapsulating polymer 3 are provided on the upper surface 3' of the encapsulating polymer 3. One lead frame 6a is connected to a die bonding electrode 7 to which the light-emitting or receiving element 4 coated with the silicone resin composition 9 is secured. The other lead frame 6b is connected to a bonding wire 5 such as a gold wire. The bonding wire 5 is connected to the light emitting or receiving element 4.

A lower portion of the lead frames 6a and 6b, die bonding electrode 7, and bonding wire 5 are sealed in the encapsulating polymer 3.

The silicone resin composition 9 used for coating the light-emitting or receiving element 4 in the present invention typically comprises a reaction product of (A) an organopolysiloxane having at least two silicon-bonded alkenyl radicals per molecule and (B) an organopolysiloxane having at least two silicon-bonded hydrogen atoms per molecule.

A typical organopolysiloxane (A) used for obtaining the reaction product has formula (I):

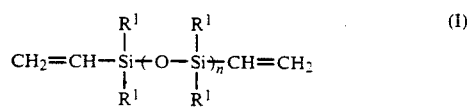

wherein $R^1$ is independently selected from the class consisting of halogen atoms, substituted or unsubstituted monovalent hydrocarbons, alkoxy radicals, and alkaloyl radicals, and n is a positive integer preferably in the range of from 10 to 1,500, and more preferably from 200 to 600.

Exemplary halogen atoms include chlorine. Exemplary substituted or unsubstituted monovalent hydrocarbons include alkyl radicals such as methyl, ethyl, and propyl radicals; aromatic hydrocarbons such as phenyl and benzyl radicals; cycloaliphatic hydrocarbons such as cyclohexyl and dicyclopentadienyl radicals; and alkenyl radicals such as vinyl, allyl, and hexene-1-yl radicals. Exemplary alkoxy radicals include methoxy, ethoxy, and propoxy radicals. Exemplary alkaloyl radicals include methacryloyl, propanoyl, ethanoyl, and acetyl radicals. The above-mentioned radicals may have their hydrogen atoms partly or totally substituted with a substituent such as a halogen atom.

The most preferable organopolysiloxane (A) is the one wherein all of $R^1$ is methyl and n is an integer in the range of from 250 to 300.

A typical organopolysiloxane (B) used for obtaining the reaction product has formula (II):

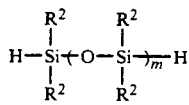

wherein $R^2$ is independently selected from the class consisting of hydrogen atom and radicals represented by $R^1$ of general formula (I), and m is a positive integer preferably in the range of from 10 to 1,500, and more preferably from 20 to 500. The most preferable organopolysiloxane (B) is the one wherein all of $R^2$ is methyl and m is an integer in the range of from 300 to 500.

In the reaction, organopolysiloxanes (A) and (B) are used in a weight ratio (A):(B) in the range of from 50:1 to 5:1, and preferably from 40:1 to 10:1. The silicone resin composition wherein organopolysiloxanes (A) and (B) are mixed in such a ratio is capable of firmly bonding to the light-emitting or receiving element, and the film formed from such a resin composition has a mechanically sufficient strength.

The silicone resin composition employed in the present invention may be a reaction product of the above described organopolysiloxanes (A) and (B). Also, there may be employed silicone resin compositions comprising reaction products of organopolysiloxanes (A) and (B), and at least one additional organopolysiloxane selected from organopolysiloxanes (C), (D) and (E) having the following formulae:

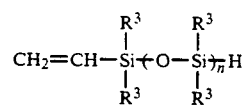

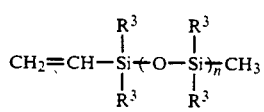

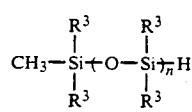

wherein $R^3$ is independently selected from the radicals represented by $R^2$, and n is a positive integer preferably in the range of from 10 to 1,500, and more preferably from 20 to 500. The organopolysiloxanes (C), (D) and (E) may together comprise up to 30% by weight, and preferably, up to 20% by weight of the total reaction mixture to be cured.

A catalyst selected from platinum, ruthenium, silver and their compounds such as chloroplatinic acid $H_2PtCl_6$ may be optionally used in the reaction for obtaining the reaction product of organopolysiloxanes (A) and (B), and optionally (C), (D), and (E). The catalyst, when used, may comprise from 1 to 100 ppm based on the sum of organopolysiloxanes (A) and (B) on the weight basis.

The light-emitting or receiving element 4 may be coated with the silicone resin composition 9 by directly applying a liquid coating mixture comprising organopolysiloxanes (A) and (B) and other optional ingredients including the catalyst to the light-emitting or receiving element 4, or by dipping the light-emitting or receiving element 4 in said liquid coating mixture, and thereafter, heating the light-emitting or receiving element 4 to about 80° to 220° C., and preferably, about 120° to 170° C. for at least 1 hour, and preferably, for about 2 to 6 hours to cure the silicone resin composition through the reaction between organopolysiloxanes (A) and (B). Organopolysiloxanes (A) and (B) may be stored in a mixed state (one-pot or single-composition system), or may be mixed immediately before use (two-pot or two composition system).

The silicone resin composition 9 may be coated on light-emitting or receiving element 4 to a thickness of 0.5 to 100 μm, and more preferably to a thickness of 1 to 10 μm.

The silicone resin composition 9 may be coated only on light-emitting or receiving element 4 as in the case of the above-described embodiment but also on other parts connected to light-emitting or receiving element 4 such as lead frames 6a and 6b.

The light-emitting or receiving device of the present invention has improved moisture resistance since light-emitting or receiving element 4 is coated with a layer of silicone resin composition 9. The layer of silicone resin composition 9 also moderates tensions exerted on light-emitting or receiving element 4 through polymerization of encapsulant 13 as will be described later in FIG. 2.

The light-emitting or receiving element 4 employed in the light-emitting or receiving device 1 in accordance with the present invention is not limited to any particular type, and may be light-emitting diode, semiconductor laser, electroluminescence cell, CCD cell, photodiode, or the like.

The light-emitting or receiving element 4 coated with the silicone resin composition 9 as described above is encapsulated with a specific encapsulating polymer 3, which comprises a polymer of a monomer, an oligomer or a mixture thereof containing a diallyl compound as an essential ingredient. The monomer, oligomer or mixture thereof containing a diallyl compound as an essential ingredient is hereinafter referred to as an encapsulant 13.

The encapsulant may comprise, for example, a monomer or an oligomer or a mixture thereof of a di(allyl carbonate) of an aliphatic, cycloaliphatic or aromatic dihydric alcohol.

Examples of such encapsulant include (I) a copolymerizable composition comprising a diallyl ester of a nuclearly halo-substituted benzene dicarboxylic acid and diethylene glycol diallyl carbonate as disclosed in Japanese Patent Application Kokai No. 59-45312;

(II) a copolymerizable composition comprising at least one ester of a nuclearly halo-substituted benzene dicarboxylic acid (for example, bisallyl 2,4-dichloroterephthalate) and at least one radical-polymerizable monofunctional monomer bearing an aromatic ring and capable of forming a homopolymer having a refractive index of at least 1.55 (for example, phenyl methacrylate) as disclosed in Japanese Patent Application Kokai No. 59-8709;

(III) a copolymerizable composition comprising at least one bisallyl carbonate or bis-β-methylallyl carbonate (for example, 1,4-bis(hydroxyethoxy)benzene bisallyl carbonate) and at least one radical-polymerizable monofunctional monomer bearing an aromatic ring and capable of forming a homopolymer having a refractive index of at least 1.55 (for example, phenyl methacrylate) as disclosed in Japanese Patent Application Kokai No. 59-8710;

(IV) a copolymerizable composition comprising a monomer obtained by reacting a monool (for example, 4-benzyl-phenol) with an unsaturated carboxylic acid or chloride thereof (for example, acrylic acid or chloride thereof) and a radical-polymerizable monomer capable of forming a homopolymer having a refractive index of at least 1.55 (for example, styrene) as disclosed in Japanese Patent Application Kokai No. 59-96109;

(V) a copolymerizable composition comprising a chlorobenzoic acid allyl ester (for example, 2,3-dichlorobenzoic acid diallyl ester) and a difunctional monomer (for example, tetrabromophthalic acid diallyl ester) as disclosed in Japanese Patent Application Kokai No. 59-96113;

(VI) a copolymerizable composition as disclosed in Japanese Patent Application Kokai No. 59-184210;

(VII) diethylene glycol bisallyl carbonate; and (VIII) a composition comprising (a') a monomer or an oligomer or a mixture thereof of a bis(allyl carbonate) of an aliphatic, cycloaliphatic or aromatic dihydric alcohol (hereinafter sometimes simply referred to as dihydric alcohol) having the general formula:

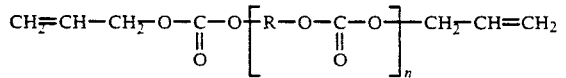

wherein R is a residue of an aliphatic, cycloaliphatic or aromatic dihydric alcohol, and n has a value or an average value in the range of from 1 to 10, preferably from 2 to 10.

Component (a') is preferably the reaction product of diallyl carbonate and a dihydric alcohol in a molar ratio of 4:1 or lower, more preferably in a molar ratio of 2:1.

Preferred examples of the dihydric alcohol include ethylene glycol, 1,3-propanediol, 1,4-butanediol, 1,6-hexanediol, diethylene glycol, polyethylene glycol, dipropylene glycol, propylene glycol, neopentyl glycol, trimethylpentane diol, cyclohexane dimethanol, bis(hydroxymethyl)tricyclodecane, 2,7-norbornane diol, α,α'-xylene diol, 1,4-bis(hydroxyethoxybenzene), and 2,2-bis[4-(hydroxyethoxy)phenyl]propane alone and mixtures thereof.

The encapsulant employed in the present invention may also comprise a liquid composition comprising components (a"), (b), and (c) shown below. This encapsulant is described in Japanese Patent Application Kokai No. 59-140214, which is incorporated herein by reference.

This composition comprises (a") 10 to 90% by weight of an oligomer or a mixture of oligomers of a bis(allyl carbonate) of an aliphatic, cycloaliphatic or aromatic dihydric alcohol having the general formula:

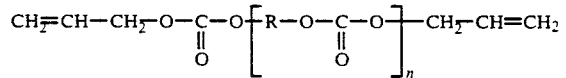

wherein R is a residue of an aliphatic, cycloaliphatic or aromatic dihydric alcohol, and n has a value or an average value in the range of from 1 to 10, preferably from 2 to 10, with the proviso that the content of a dihydric alcohol bis(allyl carbonate) monomer optionally present in the oligomer is up to 50% by weight;

(b) 0 to 90% by weight of a compound selected from the group consisting of (b-1) a monomeric di- or tri(allyl carbonate) of an aliphatic, cycloaliphatic or aromatic di- or trihydric alcohol having the general formula:

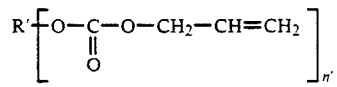

wherein R' is a residue of a di- or trihydric alcohol, and n' is equal to 2 or 3, or a mixture thereof, with the proviso that the content of an oligomeric di(allyl carbonate) of a di- or trihydric alcohol or a poly(allyl carbonate) of a di- or trihydric alcohol optionally present in the monomer or the mixture is up to 30% by weight, (b-2) an allyl ester of an aliphatic or aromatic di- or tricarboxylic acid having the general formula:

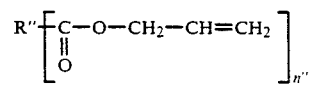

wherein R" is a residue of a di- or tricarboxylic acid, and n" is equal to 2 or 3, and (b-3) triallyl cyanurate and triallyl isocyanurate; and (c) 0 to 30% by weight of an acrylic or vinyl monomer; with the proviso that the total of components (b) and (c) is more than 0.

The preferred component (a") is the reaction product of diallyl carbonate and a dihydric alcohol in a molar ratio of 4:1 or lower, more preferably in a molar ratio of 2:1. The dihydric alcohol is preferably selected from the group consisting of ethylene glycol, 1,3-propanediol, 1,4-butanediol, 1,6-hexanediol, diethylene glycol, polyethylene glycol, dipropylene glycol, propylene glycol, neopentyl glycol, trimethylpentane diol, cyclohexane dimethanol, bis(hydroxymethyl)tricyclodecane, 2,7-norbornane diol, α,α'-xylene diol, 1,4-bis(hydroxyethoxybenzene), and 2,2-bis[4-(hydroxyethoxy)phenyl]propane.

The preferred component (b) is the reaction product of diallyl carbonate and a di- or trihydric alcohol in a molar ratio of 6:1 or higher, more preferably in a molar ratio of 12:1. The di- or trihydric alcohol is preferably selected from the group consisting of ethylene glycol, 1,3-propanediol, 1,4-butanediol, 1,6-hexanediol, diethylene glycol, polyethylene glycol, dipropylene glycol, propylene glycol, neopentyl glycol, trimethylpentane diol, cyclohexane dimethanol, bis(hydroxymethyl)tricyclodecane, 2,7-norbornane diol, α,α'-xylene diol, 1,4-bis(hydroxyethoxybenzene), 2,2-bis[4-(hydroxyethoxy)phenyl]propane, trimethylol propane, and tri(hydroxyethyl) isocyanurate alone and mixtures thereof.

Also included in component (b) are diallyl phthalate, diallyl succinate, diallyl adipate, diallyl chlorendate, diallyl glycolate, diallyl naphthalene dicarboxylate, and triallyl mellitate.

Component (c) is preferably selected from vinyl acetate, vinyl benzoate, methyl methacrylate, phenyl methacrylate, methyl acrylate, methyl maleate, maleic anhydride, and vinylidene chloride alone and mixtures thereof.

The encapsulant may also comprise copolymerizable compositions of a bisallyl compound such as diethylene glycol bisallyl carbonate, 1-4-bis(hydroxyethoxy)benzene bisallyl carbonate, and 2,4-dichloroterephthalic acid bisallyl ester and a vinyl monomer having an aromatic ring such as phenyl methacrylate and benzyl methacrylate.

The encapsulant as mentioned above may contain another monomer and a filler in such amounts that they do not detract from the physical properties of the resulting polymer. For example, a mono (meth)acrylic compound, di(meth)acrylic compound, or unsaturated carboxylic acid such as maleic anhydride may be added in an amount of up to 30% by weight, or a silane coupling agent such as vinyl triethoxysilane may be added in an amount of up to 10% by weight, based on the weight of the polymer.

In the practice of the present invention, the encapsulant may further contain a polymerization initiator.

The polymerization initiator used in polymerizing the encapsulant may be any of photo polymerization initiators, thermal polymerization initiators, and photo and thermal polymerization initiators, and mixtures thereof.

The photo polymerization initiators include electron beam and radiation polymerization initiators as well as photo polymerization initiators.

A typical example of the photo polymerization initiator is 2-hydroxy-2-methyl-1-phenyl-propan-1-one.

Examples of the thermal polymerization initiators include peroxydicarbonates such as diisopropyl peroxydicarbonate, di-secbutyl peroxydicarbonate, dicyclohexyl peroxydicarbonate, and tert-butyl perbenzoate; organic peroxides such as benzoyl peroxide, acetyl peroxide, tert-butyl hydroperoxide, cumene hydroperoxide, di-tert-butyl peroxide, tert-butyl peroxybenzoate, lauroyl peroxide, diisopropyl peroxydicarbonate, methyl ethyl ketone peroxide, and diacyl peroxide; inorganic peroxides; and radical initiators such as azobisisobutyronitrile and azobismethylisovaleronitrile.

A typical example of the photo and thermal polymerization initiators is the compound of the following formula:

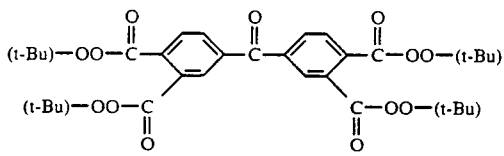

Polymerization initiator may be used to polymerize encapsulant in an amount of 0.1 to 10% by weight, preferably 1 to by weight based on encapsulant.

Encapsulant may be used in semi-cured state or B stage if desired.

Figure 2:
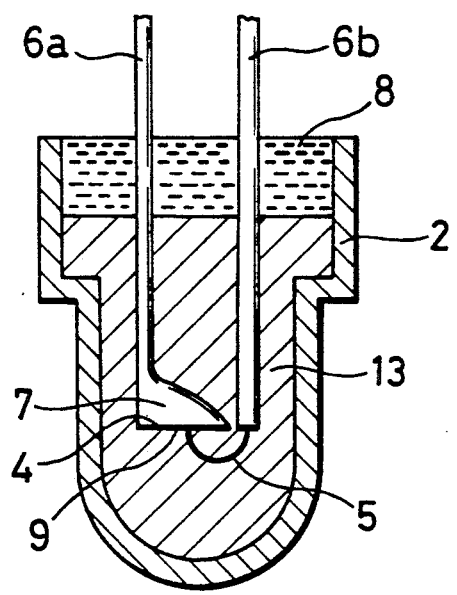
FIG. 2 is a vertical cross-sectional view illustrating one embodiment of manufacturing a light-emitting or receiving device according to the present invention.

The method for encapsulating the element 4 which has been coated with the silicone resin composition 9 with the encapsulant is not particularly limited insofar as the method can form the polymer 3 (See FIG. 1) by placing the element 4 as follows. In FIG. 2, one lead frame 6a is connected to a die bonding electrode 7 to which the light-emitting or receiving element 4 coated with silicon resin composition 9 is secured. The other lead frame 6b is connected to a bonding wire 5. The bonding wire 5 is connected to the light emitting or receiving element 4.

A lower portion of the lead frames 6a and 6b, die bonding electrode 7, and bonding wire 5 are placed in a mold 2, filling the mold 2 with encapsulant 13, polymerizing the encapsulant as shown in FIG. 2. The following encapsulating method is preferred.

(1) The encapsulant is polymerized in the mold while the surface of encapsulant 13 in the mold is in contact with an inert gas atmosphere having no oxygen contaminated thereto or an inert gas atmosphere having an oxygen concentration of up to 1% by volume, preferably up to 0.5%, more preferably up to 0.01% at most.

If the encapsulant to be polymerized in the presence of a radical polymerization initiator is in contact with air, oxygen will consume active radicals so that the surface of the polymerizing encapsulant in contact with air may sometimes remain viscous liquid or gel without reaching a sufficient molecular weight.

In order to complete polymerization evenly so that the surface hardness may reach a pencil hardness of at least 2B, preferably at least HB, the atmosphere under which polymerization is carried out should be an inert gas such as nitrogen and argon having an oxygen concentration of up to 1% by volume, preferably up to 0.5%, more preferably up to 0.01%.

(2) Encapsulant 13 is polymerized in the mold while the surface of encapsulant 13 in the mold is coated with a liquid 8 having a low solubility in encapsulant 13 and a density lower than encapsulant 13.

Liquid 8 is not particularly limited as long as it is less soluble in encapsulant 13 and has a lower density than encapsulant 13.

The density of liquid 8 is preferably from 0.7 to 1 g/cm$^3$, more preferably from 0.8 to 0.95 g/cm$^3$.

Consumption of radicals in the encapsulant can be controlled for the same reason as in method (1).

Liquid 8 may be water, for example, which seals any opening to block the oxygen from contacting with the encapsulant. Water is suitable for polymerization at relatively low temperatures because of its high vapor pressure.

Liquid 8 may also be a liquid synthetic hydrocarbon polymer having a low molecular weight or a liquid hydrocarbon mixture such as mineral oil.

Examples of the synthetic hydrocarbon polymers include poly($\alpha$-olefin) oils such as polydecene-1, alkyl aromatic oils such as alkylbenzenes, polybutene oil or liquid polybutene, polyhexene, alkylnaphthene oils such as 2,4-dicyclohexyl-2-methylpentane oil, and ethylene-$\alpha$-olefin random copolymer oils such as ethylene-propylene random copolymer oil.

Preferred among them are those having a molecular weight of at least 500, more preferably from 1,000 to 10,000.

Also preferred are ethylene-$\alpha$-olefin random copolymer oils having a number average molecular weight (Mn) of from 500 to 5,000, especially from 1,500 to 3,000.

Particularly preferred are liquid, low-molecular weight ethylene-$\alpha$-olefin copolymers consisting of 30 to 70 mol % of ethylene units and 30 to 70 mol % of preferably $C_{3-5}$, and more preferably $C_{3-6}$ $\alpha$-olefin units and having a number average molecular weight (Mn) of from 1,000 to 5,000 and a Q value (weight average molecular weight/number average molecular weight) of up to 3.

When liquid is a liquid polyolefin or the like, the liquid itself exhibits mold release effect, considerably facilitating mold release operation. At the end of polymerization, the liquid polyolefin may be readily removed with an organic solvent such as hexane, kerosene, and trichloroethylene.

(3) Encapsulating methods (1) and (2) may be combined.

Encapsulant 13 is polymerized in the mold while the surface of encapsulant 13 in the mold is coated with liquid 8 and further with an inert gas atmosphere having an oxygen concentration of up to 1%.

Better results are obtained from the combined use of encapsulating methods (1) and (2).

Polymerization may be carried out under various conditions depending on the identity of polymerization initiator. In the case of thermal polymerization, the composition may be heated in a heating tank to a temperature of about 30° to 150° C., preferably about 40° to 120° C. for about ½ to 72 hours, preferably about 1 to 4 hours, although the exact value will vary with the shape and size. In the case of photo polymerization, polymerization may be carried out, for example, under a high-pressure mercury lamp with a power of 60 to 150 W/cm for about 1 minute to 2 hours, preferably 3 to 30 minutes at a temperature of about 40° to 120° C., preferably about 60° to 100° C.

EXAMPLES

Examples of the present invention are given below by way of illustration.

EXAMPLE 1

An assembly of a GaAlAs light-emitting diode with bonding wire and lead frames was dipped in a bath containing a silicone resin solution at room temperature to coat the light-emitting diode with a silicone resin composition.

The silicone resin solution was prepared by dissolving a mixture of organopolysiloxane (A) represented by the formula:

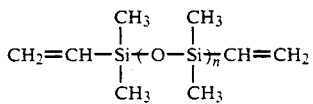

wherein n is 430, and having a number average molecular weight Mn of 32,000 calculated as polystylene when determined by GPC and organopolysiloxane (B) represented by the formula:

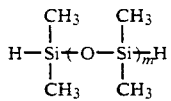

wherein m is 338, and having a number average molecular weight of 25,000 calculated as polystylene when determined by GPC in a mixing ratio (A)/(B) of 20/1 in xylene to a concentration of 30%.

The thus dipped assembly was taken out of the bath containing the silicone resin solution, heated in an air oven at 150° C. for 4 hours to cure the silicone resin composition. The thickness of the resin was 10 μm.

Next, the resulting assembly of the GaAlAs light-emitting diode with the lead frames wherein the diode has been coated with the silicone resin composition was set in a mold of polypropylene having an inner diameter of 5 mm and a depth of 10 mm. The mold was filled with a homogeneously mixed liquid composition given below as encapsulant [A]-I. The mold was placed in a vacuum oven, which was purged with nitrogen gas, and then heated stepwise from 40° C. to 90° C., completing polymerization in 3 hours. After curing of the encapsulant, the light-emitting device was released from the mold to obtain the device as shown in FIG. 1.

| [A]-I | |
|---|---|
| (a) The reaction product obtained by reacting diallyl carbonate with diethylene glycol in a molar ratio of 2:1 in the presence of sodium ethoxide under the conditions described in Japanese Patent Application Kokai No. 56-133246 (consisting of 30% by weight of diethylene glycol bisallyl carbonate and 70% by weight of oligo-carbonate, n = 3 to 10) | 55% by weight |
| (b) Tris(allyl carbonate) of tris-(hydroxyethyl) isocyanurate obtained by reacting diallyl carbonate with tris(hydroxyethyl) isocyanurate in a molar ratio of 12:1 | 12.4% by weight |
| (c) Diethylene glycol bisallyl carbonate | 27.5% by weight |
| (d) Vinyl acetate | 5% by weight |
| (e) Polymerization initiator (per 100 parts of the foregoing ingredients (a), (b), (c), and (d)) Diisopropyl peroxydicarbonate | 2.5 parts by weight |

EXAMPLE 2

An assembly of a light-emitting diode with lead frames wherein the diode has been coated with the silicone resin composition as set forth in Example 1 was set in a mold of poly-4-methyl-1-pentente having an inner diameter of 5 mm and a depth of 10 mm as shown in FIG. 2. A composition given below as encapsulant [A]-II was cast into the mold and then coated with a layer of a liquid ethylene-propylene copolymer (Mn 2500, Q 2.0, specific gravity 0.846) having a thickness of about 2 mm. The mold was placed in an air oven, which was heated stepwise from 40° C. to 90° C., completing polymerization in 3 hours. After curing of the encapsulant, the light-emitting device was released from the mold to obtain the device as shown in FIG. 1.

| [A]-II | |
|---|---|
| (a) The reaction product obtained by reacting diallyl carbonate with diethylene glycol in a molar ratio of 2:1 in the presence of sodium ethoxide under the conditions described in Japanese Patent Application Kokai No. 56-133246 (consisting of 30% by weight of diethylene glycol bisallyl carbonate and 70% by weight of oligo-carbonate, n = 3 to 10) | 58% by weight |
| (b) Tris(allyl carbonate) of tris-(hydroxyethyl) isocyanurate obtained by reacting diallyl carbonate with tris(hydroxyethyl) isocyanurate in a molar ratio of 12:1 | 13% by weight |
| (c) Diethylene glycol bisallyl carbonate | 29% by weight |
| (d) Polymerization initiator (per 100 parts of the foregoing ingredients (a), (b), and (c)) Diisopropyl peroxydicarbonate | 2.7 parts by weight |

EXAMPLE 3

The procedure of Example 2 was repeated except that encapsulant [A]-II was replaced by [A]-I, completing polymerization in 3 hours as in Example 2 to obtain the light-emitting device.

COMPARATIVE EXAMPLE 1

An assembly of a light-emitting diode which has not been coated with the silicone resin composition with lead frames was set in a similar manner as Example 1 in a mold of poly-4-methyl-1-pentente having an inner diameter of 5 mm and a depth of 10 mm to which a silicone based release agent, Epolease #95 (manufactured by NIPPON PELNOX K.K.) has been applied. An epoxy resin of the light emitting diode encapsulating grade was cast into the mold. The epoxy resin consisted of 100 parts of a major agent, Pelnox XN-1886-3, which is generally employed for encapsulating light-emitting diodes, and 110 parts of a curing agent, Pelcure XV-2263 (manufactured by NIPPON PELNOX K.K.). The epoxy resin was cured at 120° C. for 8 hours to obtain the light-emitting device.

COMPARATIVE EXAMPLE 2

The procedure of Example 2 was repeated except that the light-emitting diode was not coated with the silicone resin composition.

The light-emitting devices obtained in the foregoing Examples and Comparative Examples were evaluated as follows for their (1) mold release, (3) weatherability, (4) surface hardness, and (5) moisture resistance. Evaluation was also carried out for (2) transparency of the encapsulants [A]-I and [A]-II after curing. The results are shown in Table 1.

(1) Mold Release

Mold release was evaluated by removing the encapsulated light-emitting device from the mold.
⊚: very easily releasable
○: manually releasable
X: manually unreleasable

(2) Transparency of the Cured Encapsulant

Visual observation
○: good
⊚: excellent

Encapsulants [A]-I and [A]-II and the epoxy resin used in Comparative Example 1 were polymerized into plates of 3.0 mm thick under the same conditions as described for Examples 1–3 and Comparative Examples 1 and 2, and measured for light transmittance using an auto-recording spectrophotometer, model U-3400 of Hitachi, Ltd.

(3) Weathering Test (a)

Using an accelerated weathering tester (model SUV-WII of Iwasaki Electric K.K.), a sample of the light-emitting device was exposed to light under the following conditions.
Ultraviolet intensity: 100 mW/cm$^2$
Black panel temperature: 63° C.
Relative humidity: 50–70%
A cycle consisted an exposure time of 8 hours and a dewing time of 4 hours, and the test was carried out by repeating 6 cycles.

Weathering Test (b)

Using an accelerated weathering tester (model WEL-6X-HC-BEC of Suga Tester K.K.), a sample of the light emitting device was exposed to light under the following conditions.
Light source: 6.0 kW xenon lamp
panel temperature: 63° C.
Relative humidity: 50%
A cycle consisting of an exposure time of 200 minutes (including a raining time of 18 minutes) was repeated to a total exposure of 100 hours.

The light transmittance and luminous power were measured for the light emitting device before and after the above-mentioned weathering tests.

(4) Surface Hardness

A barrel portion of the cured encapsulant of the light-emitting device was measured for surface hardness by a method according to JIS K5401.

(5) Moisture Resistance

The light-emitting device was left in an incubator at a temperature of 85° C. and relative humidity of 80% for 1,000 hours. Luminous power was measured before and after the exposure to moisture to calculate percent change in luminous power.

TABLE 1

| | Example | | | Comparative Example | |
|---|---|---|---|---|---|
| | 1 | 2 | 3 | 1 | 2 |
| Mold release | ○ | ⊚ | ⊚ | X | ⊚ |
| Transparency | ⊚ | ⊚ | ⊚ | ○ | ⊚ |
| Polymerizing time. hr | 3 | 3 | 3 | 8 | 3 |
| Weathering test (a) | | | | | |
| (1) Light transmittance. % | | | | | |
| Before test | | | | | |
| 760 nm | 92 | 92 | 92 | 84 | 92 |
| 620 nm | 92 | 92 | 92 | 81 | 92 |
| 400 nm | 90 | 90 | 90 | 69 | 90 |
| After test | | | | | |
| 760 nm | 92 | 92 | 92 | 83 | 92 |
| 620 nm | 92 | 92 | 92 | 78 | 92 |
| 400 nm | 83 | 83 | 83 | 33 | 83 |
| Weathering test (b) | | | | | |
| (2) Luminous power. mW | | | | | |
| Before test | — | 2.3 | — | 2.3 | 2.3 |
| After test | — | 2.2 | — | 2.0 | 2.2 |
| Surface hardness | 4H | 4H | 4H | 3H | 4H |
| Moisture resistance Luminous power retention 85° C. relative humidity 80%, after 1,000 hrs. | 94 | 96 | 97 | 96 | 85 |

The light-emitting or receiving device of the present invention which is encapsulated with a polymer of a monomer, an oligomer or a mixture thereof containing a diallyl compound as an essential ingredient has improved weatherability, chemical resistance, hardness, and optical properties such as transparency.

The light-emitting or receiving device of the present invention which has its light-emitting or receiving element with a specific silicone resin composition also has improved moisture resistance.

The application in which the light-emitting or receiving device of the present invention having such improved properties is utilized include light-emitting devices such as LED, laser diodes, photo-sensors, photodiodes, and electroluminescence cells as well as light-receiving devices such as photodiodes.

We claim:

1. A light-emitting or receiving device comprising a light-emitting or receiving element coated with a silicone resin composition and an encapsulating means for encapsulating said light-emitting or receiving element, said encapsulating means comprising a polymerizable liquid composition comprising (a″) 10 to 90% by weight of an oligomer or a mixture of oligomers of a di(allyl carbonate) of an aliphatic, cycloaliphatic or aromatic dihydric alcohol having the formula:

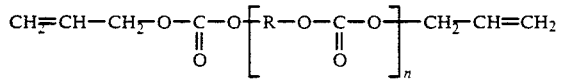

wherein R is a radical of the aliphatic, cycloaliphatic or aromatic dihydric alcohol, and n has a value or an average value in the range of from 1 to 10, with the proviso that the content of a dihydric alcohol di(allyl carbonate) monomer optionally present in the oligomer is up to 50% by weight;

(b) 0 to 90% by weight of a compound selected from the group consisting of (b-1) a monomeric di- or tri(allyl carbonate) of an aliphatic, cycloaliphatic or aromatic di- or trihydric alcohol having the formula:

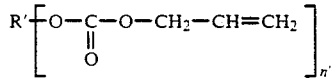

wherein R' is the radical of a di- or trihydric alcohol, and n' is equal to 2 or 3, with the proviso that the content of an oligomeric di(allyl carbonate) of a di- or trihydric alcohol or a ploy(allyl carbonate) of a di- or trihydric alcohol optionally present in a monomer or mixture of monomers is up to 30% by weight, (b-2) an allyl ester of an aliphatic or aromatic di- or tricarboxylic acid having the formula:

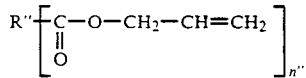

wherein R″ is the radical of a di- or tricarboxylic acid, and n″ is equal to 2 or 3, and (b-3) triallyl cyanurate and triallyl isocyanurate; and (c) 0 to 30% by weight of an acrylic or vinyl monomer, with the proviso that the total of components (b) and (c) is more than 0, wherein the silicone resin composition comprises a reaction product of an organopolysiloxane represented by formula (I):

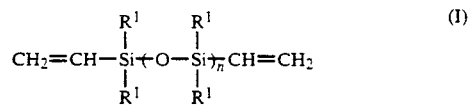

wherein $R^1$ is independently selected from the group consisting of halogen atoms, substituted or unsubstituted monovalent hydrocarbons, alkoxy radicals and alkaloyl radicals, and n is a positive integer: and an organopolysiloxane represented by formula (II):

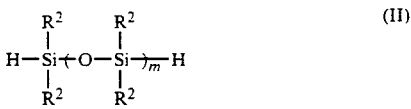

wherein $R^2$ is independently selected from the group consisting of hydrogen atoms and radicals represented by $R^1$ of formula (I), and m is a positive integer.

2. The light-emitting or receiving device according to claim 1 wherein said organopolysiloxanes (I) and (II) are used in a weight ration (I):(II) in the range of from 50:1 to 5:1.

3. The light-emitting or receiving device according to claim 1 wherein said reaction product further comprises at least on additional organopolysiloxane selected from ogranopolysiloxanes (C), (D) and (E) having the following formulae:

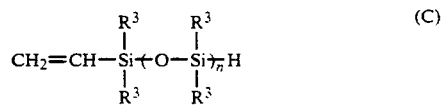

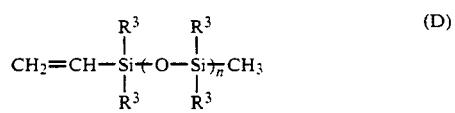

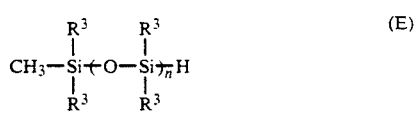

wherein $R^3$ is independently selected from the radicals represented by $R^2$, and n is a positive integer.

4. A light-emitting or receiving device comprising a light-emitting or receiving element coated with a silicone resin composition and an encapsulating means for encapsulating said light-emitting or receiving element, said encapsulating means comprising a polymer of a monomer, an oligomer or a mixture thereof comprising a diallyl compound, wherein said silicone resin composition comprises a reaction product of an organopolysiloxane represented by formula (I):

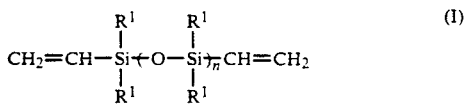

wherein $R^1$ is independently selected from the group consisting of halogen atoms, substituted or unsubstituted monovalent hydrocarbons, alkoxy radicals and alkaloyl radicals, and n is a positive integer: and an organopolysiloxane represented by formula (II):

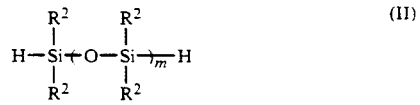

wherein $R^2$ is independently selected from the group consisting of hydrogen atom and radicals represented by $R^1$ of formula (I), and m is a positive integer.

5. The light-emitting or receiving device according to claim 4 wherein said organopolysiloxanes (I) and (II) are used in a weight ratio (I):(II) in the range of from 50:1 to 5:1.

6. The light-emitting or receiving device according to claim 4 wherein said reaction product further comprises at least one additional organopolysiloxane selected from organopolysiloxanes (C), (D) and (E) having the following formulae:

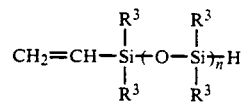 (C)

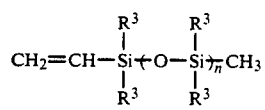 (D)

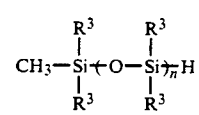 (E)

wherein $R^3$ is independently selected from the radicals represented by $R^2$, and n is a positive integer.

* * * * *